United States Patent [19]

Furrer et al.

[11] 3,969,323

[45] July 13, 1976

[54] PHOTO-CROSSLINKABLE 2-PYRONE POLYMERS AND PROCESSES FOR THE MANUFACTURE THEREOF

[75] Inventors: Harald Furrer, Frankfurt am Main; Hartmut Steppan, Wiesbaden-Dotzheim; Gerhard Lohaus, Kelkheim, Taunus, all of Germany

[73] Assignee: Hoechst Aktiengesellschaft, Germany

[22] Filed: Feb. 26, 1974

[21] Appl. No.: 445,981

[30] Foreign Application Priority Data
Mar. 1, 1973 Germany............................ 2310307

[52] U.S. Cl............................. 260/73 R; 260/17 R; 260/17.4 CL; 260/47 R; 260/67.5; 260/75 T; 260/78.3 UA; 260/59 R; 526/266; 526/271; 526/272; 526/303; 526/329; 526/331; 526/342; 260/875; 260/79; 260/79.3 R
[51] Int. Cl.$^2$................... C08F 16/38; C08G 63/46

[58] Field of Search..... 260/78.3 UA, 73 R, 88.3 A, 260/343.5, 75 T

[56] References Cited
UNITED STATES PATENTS
3,743,658  7/1973  Klebe............................... 260/343.5
FOREIGN PATENTS OR APPLICATIONS
908,281  10/1962  United Kingdom................. 260/875

OTHER PUBLICATIONS
Chemical Abstracts, vol. 72, (1970), 32303d.

Primary Examiner—Lucille M. Phynes
Attorney, Agent, or Firm—James E. Bryan

[57] ABSTRACT

This invention relates to a photo-crosslinkable polymer comprising units with side chains having 2-pyrone groups therein. The invention also relates to processes for the preparation of the novel photo-crosslinkable polymers and to a photo-curable copying composition including the photo-crosslinkable polymer.

16 Claims, No Drawings

PHOTO-CROSSLINKABLE 2-PYRONE POLYMERS AND PROCESSES FOR THE MANUFACTURE THEREOF

It is known to build up coatings of polymeric substances which are photo-crosslinkable because they contain photo-reactive groupings. Such photo-crosslinkable polymers have been used with success in photosensitive copying compositions or copying materials for the production of tanned images, printing plates and, particularly, photoresists.

Cinnamic acid esters of polyalcohols, for example polyvinyl cinnamate, have attained particular importance. They are obtained by esterification of polyvinyl alcohol or of partially saponified polyvinyl acetate. It is not possible to manufacture them directly by polymerization of cinnamic acid vinyl esters since under the polymerization conditions, cyclopolymerizations in part already take place, and crosslinking occurs.

The subsequent esterification of polyvinyl alcohol has considerable disadvantages. It can be carried out only in special solvents such as pyridine and does not take place quantitatively even then; rather, only a part of the hydroxyl groups of the vinyl alcohol can be esterified. If value is attached to a high density of crosslinking, the photosensitive polymer obtained is inadequate.

German Offenlegungsschrift No. 1,570,224 discloses photosensitive polymers containing coumarin groups, which are suitable for the manufacture of photo-crosslinkable copying materials. However, these polymers dissolve only in a limited number of organic solvents so that they ae difficult to develop. Furthermore it would be desirable to be able to manufacture copying materials of higher photosensitivity than that displayed by these known polymers.

The present invention is based on the object of developing new photo-crosslinkable polymers which are easy to manufacture and of which the physical and chemical properties can be largely influenced by varying their composition so that good properties with respect to photosensitivity, ease of development, ease of solution, etch resistance, adhesion, heat resistance, and the like, of the products may be achieved. It has been found that the problem can be solved by providing new polymers which contain 2-pyrone units as photoactive groups.

The subject of the invention is photo-crosslinkable polymers which contain units with side chains having 2-pyrone groups. The pyrone groups can be bonded directly or via linking members to a polymer chain and additionally can be substituted by alkyl groups with 1–4 C atoms or by halogen atoms, preferably Cl or Br. The preferred alkyl group is the methyl group and particularly preferred pyrone groups are those carrying a methyl group in the 4-position of the pyrone ring.

According to a preferred embodiment, the units containing 2-pyrone groups have the general formula

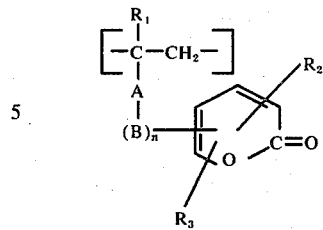

wherein $R_1$, $R_2$ and $R_3$ are H, halogen, or alkyl with 1–4 C atoms, A is a single bond or one of the groups -CONH-, -COO-, -OCO-, -O-CHOH- or -O-CH-O-, with each oxygen atom of the lastmentioned group being bonded to a unit of the base chain, B is an alkylene or alkyleneoxy group with 1 to 4 C atoms which can be interrupted by an oxygen or sulfur atom or a sulfonyl group, and $n$ is 0 or 1.

The linking member or the direct bond to the polymer chain can connect to the 3-, 4-, 5- or 6-position of the pyrone ring and the 6-position is particularly preferred because of greater ease of manufacture of the products.

Preferred linking members to the polymer chain are ester groups, acid amide groups or acetal groups which can, in turn, also contain a short alkylene chain, preferable 1 or 2 methylene groups, as a further link to the polymer chain or to the pyrone ring.

Suitable polymer chains are, in principle, all straight-chain or branched, but not crosslinked, homopolymers or copolymers, such as polyethylenes or polymers produced from substituted ethylenes, which thus possess a continuous carbon chain, and also polyesters, polyamides or polyethers, or copolymers which contain such structural units in the chain.

Preferred photo-crosslinkable polymers are, especially because of their greater ease of manufacture, those which are produced from 2-pyrones which contain a vinyl or vinylidene group, or which contain units of such 2-pyrones. As such 2-pyrones, it is possible to use acrylate esters, and preferably methacrylate esters of 2-pyrone-alcohols, such as are disclosed in copending application Ser. No. 2,310,3062, filed Mar. 1st, 1973 in Germany, and also analogous acid amides such as can be produced, for example, from 2-pyrones carrying amino groups by reaction with acrylic acid or especially with methacrylic acid, as well as 2-pyrones which contain, in the 3-, 5- or 6-position, and preferably in the 6-position, a vinyl group which is optionally substituted by an alkyl group with 1–4 atoms or a chlorine atom.

The invention further encompasses polymeric polyhydroxy compounds of which the hydroxyl groups are completely or partially esterified with 2-pyrones carrying carboxyl groups or are completely or partially acetalized with 2-pyrones carrying aldehyde groups, as well as polycarboxylic acids of polymeric structure, of which the carboxyl groups are completely or partially esterified with 2-pyrones carrying hydroxyl groups or completely or partially converted into amides with 2-pyrones carrying amino groups.

Because of their good solubility, adhesion and mechanical properties, copolymers of the above-mentioned unsaturated 2-pyrones with ethylene or substituted ethylenes, especially with acrylic acid derivatives or methacrylic acid derivatives, above all with aromatic-substituted ethylenes, such as styrene, vinyl toluene, chlorostyrene or mixtures thereof, are preferred. The molar ratio of 2-pyrone units to comonomer units depends upon the desired physical properties of the polymer and upon the degree of crosslinking to be achieved by exposure.

Addition of as little as one mole % of a comonomer can have a noticeable effect while, on the other hand, copolymers which contain only 5 mole %, or even less, of 2-pyrone units are also still photo-crosslinkable. However, in general the proportion of monomer-containing pyrone is between 90 and 10, preferably between 75 and 25, mole %.

A further subject of the invention is a process for the manufacture of photo-crosslinkable polymers in which 2-pyrones which contain at least one polymerizable vinyl or vinylidene group are polymerized in a manner which is in itself known, preferably by radical mechanisms, and optionally together with non-photosensitive copolymerizable vinyl or vinylidene compounds.

Photo-crosslinkable polymers according to the invention also can be manufactured by esterifying or trans-esterifying or acetalizing or trans-acetalizing polymers which contain free or esterified or acetalized hydroxyl groups with 2-pyrones which carry carboxyl groups or aldehyde groups, according to methods which are in themselves known, or by esterifying or trans-esterifying polymers which contain free or esterified carboxyl groups, carboxylic acid chloride groups or carboxylic acid anhydride groups, with 2-pyrones carrying hydroxyl groups, or reacting such polymers with 2-pyrones containing amino groups.

The polymerization can be initiated by conventional initiators, for example by peroxides or azo compounds. It is preferably carried out in a solvent which is inert under the reaction conditions, for example benzene, butanone or dimethyl formamide. When working with small quantities of material, in particular, it is advantageous to effect the reactions insofar as possible with the exclusion of light of short wavelengths, that is to say, for example, to work under yellow light.

The following are exemplary of compounds of which the homopolymerization or copolymerization leads to photo-crosslinkable polymers according to the invention:

Esters of polymerizable carboxylic acids with 2-pyrones carrying hydroxyl groups, such as are disclosed, for example, in the above-mentioned patent application, are especially: 4-methyl-6-methacryloyloxymethyl-pyrone-(2), 4-methyl-6-acryloyloxymethylpyrone-(2), 3-chloro-4-methyl-6-methacryloyloxymethyl-pyrone-(2), 3,4-dimethyl-6-methacryloyloxymethyl-pyrone-(2), 4-methacryloyloxy-6-methyl-pyrone-(2), 4,6-dimethyl-3-methacryloyloxymethylpyrone-(2), 6-methyl-4-methacryloyloxymethyl-pyrone-(2) and 4,6-dimethyl-5-methacryloyloxymethyl-pyrone-(2).

Amides of polymerizable carboxylic acids with 2-pyrones carrying amino groups, for example: 4,6-dimethyl-3-methacryloylaminomethyl-pyrone-(2), 4,6-dimethyl-5-acryloylaminomethyl-pyrone-(2), 4-methyl-6-methacryloylaminomethyl-pyrone-(2), 4-methyl-6-(1-methacryloylamino-ethyl)-pyrone-(2) and 4-methyl-3-butyl-6-methacryloylaminomethyl-pyrone-(2).

2-Pyrones containing vinyl groups, for example: 4,6-dimethyl-3-vinyl-pyrone-(2), 4,6-dimethyl-5-vinyl-pyrone-(2), 4-methyl-6-vinyl-pyrone-(2), 4-methyl-3-ethyl-6-(1-methyl-vinyl)-pyrone-(2) and 4-methyl-6-(1-chloro-vinyl)-pyrone-(2).

The foregoing compounds can be polymerized, to give photo-crosslinkable polymers, either individually or with one another or together with other substituted ethylenes, for example with methyl, ethyl, butyl, n-hexyl and ethylhexyl acrylate or methacrylate, β-methoxy-ethyl, β-methoxy-β-ethoxy-ethyl or furfuryl methacrylate or with derivatives of polymerizable carboxylic acids, such as are described in DOS 2,052,569, especially acrylates or methacrylates of trialkylphosphine oxides containing hydroxyl groups, wherein the alkyl groups contain 1–4 C atoms, for example dimethyl-(methacryloyloxymethyl)-phosphine oxide, or with acrylonitrile, acrylamide, maleic anhydride, vinyl acetate, vinyl pyridine, vinyl carbazole, and especially vinyl-aromatics such as styrene, α-methylstyrene, vinyl toluene or chlorostyrene.

Esters of polymerizable carboxylic acids with unsaturated alcohols, for example methallyl acrylate and methallyl methacrylate, allyl methacrylate, methylpentenyl methacrylate or propargyl methacrylate, also can be employed in the copolymerization and have an advantageous effect on the properties of the polymers.

A further process for the manufacture of the polymers according to the invention is to react polymers containing carboxyl groups with 2-pyrones containing hydroxyl or amino groups to give esters or amides, respectively. The esters and amides, of course, also can be manufactured by other known processes.

Polymers which can be used for these reactions are in particular homopolymers and copolymers of acrylic acid and methacrylic acid and their derivatives and copolymers of maleic anhydride, for example with ethylene or styrene.

Photo-crosslinkable polymers according to the invention also can be obtained by esterifying polyhydroxy compounds of polymeric structure with 2-pyrones containing carboxyl groups. For this purpose, the hydroxyl groups do not necessarily have to be in the free form; instead they can, for example, also be esterified or acetalized, especially with readily volatile acidsor aldehydes acids or are displaced by the less volatile carboxylic acid during the reaction. Of course, the carboxylic acids also can be employed in the form of reactive derivatives such as chlorides, anhydrides or esters with readily volatile alcohols such as methanol. Polymeric polyhydroxy compounds which can be used are, above all, polyvinyl alcohol or cellulose which also can be partially esterified or etherified.

Further suitable polyhydroxy compounds are condensation products of 2,2-bis-(p-hydroxyphenyl)-propane with epichlorohydrin, condensation products of glycid and polyfunctional phenols, and polyamines, polyacetals, polyesters, polyurethanes, polyamides or polyureas comprising hydroxy groups. Polymers of similar structure are also obtained in a simple manner by homopolymerizing or copolymerizing the vinyl esters of the 2-pyrones containing carboxyl groups, in a manner which is in itself known.

Exemplary of 2-pyrones carrying carboxyl groups which can be employed in the manner indicated, are: 4-methyl-6-carboxypyrone-(2), 4,6-dimethyl-5-carboxy-pyrone-(2), 4,6-dimethyl-3-carboxy-pyrone-(2), 4-carboxy-methoxy-6-methyl-pyrone-(2), 4,6-dimethyl-5-carboxy-methyl-pyrone-(2), 4-methyl-6-(1-carboxyethyl)pyrone-(2), 4-methyl-6-(carboxymethylmercaptomethyl)-pyrone-(2) and 4-methyl-6-(carboxymethylsulfonylmethyl)-pyrone-(2).

A further process for the manufacture of photo-crosslinkable polymers within the scope of the invention comprises reacting polymeric polyhydroxy compounds with 2-pyrones carrying aldehyde groups. Polyvinyl alcohol and cellulose are preferred as polyhydroxy compounds. The hydroxy groups do not have to be present in the free form for the purpose of the reaction but also can be completely or partially esterified or acetalized, in particular with readily volatile carboxylic acids or aldehydes. The following are exemplary of aldehydes which can be used for the acetalization of polyhydroxy compounds within the scope of the invention: 4,6-dimethyl-3-formylpyrone-(2), 4,6-dimethyl-5-formyl-pyrone-(2), 4-methyl-6-formylpyrone-(2), 4-methyl-3-ethyl-6-formyl-pyrone-(2), 3-chloro-4-methyl-6-formyl-pyrone-(2), 4,6-dimethyl-3-formylmethyl-pyrone-(2), 4-methyl-6-formylmethyl-pyrone-(2), and 4-methyl-6-(2-formylpropenyl)-pyrone-(2).

Where the aforementioned compounds are not already known they can be easily manufactured from known compounds according to methods which are in themselves known. Thus, it is possible, for example, to introduce vinyl groups into 2-pyrones by alkylation with 2-chloroethanol under alkaline conditions, followed by dehydration of the alcohol. Ozonolysis of these compounds gives the aldehydes which contain the formyl group bonded directly to the ring. Alkylation of 2-pyrones with allyl halides leads, in particular, to the 3- and 5-allyl compounds which can be oxidized at the double bond to give aldehydes or carboxylic acids or hydrated to give β-hydroxy compounds. A further method of manufacture of carboxylic acids comprises the chloromethylation of 2-pyrones, reaction with alkali metal cyanides and saponification of the nitriles formed. Finally it is also possible, for example, to react the chloromethyl compounds with thioglycollic acid to give the carboxymethylmercapto-methyl-2-pyrones which additionally can be oxidized at the sulfur atom to give the corresponding sulfones. The aminoalkyl-2-pyrones can be obtained, for example, by the reaction of halogenoalkyl-2-pyrones with ammonia or derivatives thereof.

Isomer mixtures such as can be obtained, for example, in the case of substitutions of the pyrone ring if the 3- and 5-position are free, can be used in accordance with the invention in the same manner as the pure isomers.

The polymers, containing 2-pyrone groups, according to the invention are readily soluble, depending upon their composition, in one or more of the conventional solvents such as methanol, ethanol or acetone — optionally also mixtures thereof with water — or in methylene chloride, chloroform, carbon tetrachloride, methylglycol acetate, benzene, chlorobenzene, trichloroethylene, cyclohexanone, acetone, butanone or dimethyl formamide, and can be separated from insoluble constituents by solution in these solvents. They can be applied from such solutions as a thin layer on metal surfaces or plastic surfaces, and the like, and form, after removal of the solvent, a film which adheres to its base. Upon imagewise exposure using light sources conventional in reproduction technology and which are rich in light of wavelengths of 300 – 700 nm, the exposed areas become crosslinked and thereby insoluble, while the areas not exposed can be removed with a solvent so that a negative reproduction of the original is obtained.

Although the polymers according to the invention in themselves are of high photosensitivity, it is possible and at times advantageous further to increase their sensitivity by adding sensitizers. Sensitizers, which are in general employed in amounts of 0.01 to 10% by weight based on the polymer weight are, for example, quinones such as 2-ethyl-anthraquinone and phenanthrenequinone; ketones such as benzophenone, 4,4'-bis-dimethylamino-benzophenone, xanthone and thioxanthone, pyrylium and thiopyrylium salts such as 4-anisyl-2,6-diphenylthiopyrylium perchlorate; nitro compounds such as 2-chloro-4-nitroaniline and 4-nitroacenaphthene; polynuclear heterocyclic compounds such as 1,2-benzacridine, azido compounds such as 2,6-bis-(4-azido-styryl)-4-methyl-cyclohexanone and others.

Hence, a further subject of the invention is the use of polymers containing 2-pyrone groups, especially in the presence of sensitizers, for the production of photosensitive copying compositions for the most diverse applications in reprography.

The following are examples of fields of use for the novel copying compositions, which can be in the form of a copying layer on any desired carrier, for example metal (single metal or multi-metal), paper, plastic, glass or ceramic, or in the form of a self-supporting film or of a film between two protective plastic films, or in the form of a copying lacquer, that is to say a solution in a suitable solvent:

The production of printing plates for planographic printing and offset printing, screen printing, relief printing and gravure printing, and preferably the application as a photoresist for the photomechanical production of resists, especially electroplating resists or etching resists, for example for the production of printed circuits, for etching of moldings and for the production of scales, front panels and the like.

The copying composition, however, also can be used for the production of single copies either by dyeing the copying layer and dissolving away the unexposed areas after image-wise exposure, or developing the undyed layer after image-wise exposure and dyeing the image areas with a suitable dyestuff solution.

In producing single copies, the different melting or softening characteristics of unexposed and exposed areas of the layer also can be utilized, for example by transferring unexposed optionally dyed parts of the layer onto receiving sheets or by sprinkling powdered pigments onto the warmed layer, the pigments preferentially adhering to the unexposed areas of the layer.

It is possible to combine the copying compositions according to the invention with known copying compositions, for example copying compositions which contain diazo compounds, azido compounds or photo-crosslinkable or photo-polymerizable systems or which consist of such compounds or systems.

The present invention comprises a new and extremely adaptable principle for the production of valuable photo-crosslinkable polymers. In particular, it is also possible — and this is a great advantage over earlier processes for the manufacture of photoreactive polymers — to obtain products according to the invention by the conventional established polymerization processes. Practically any desired molecular weight can be obtained by choice of the comonomers and by appropriately carrying out the experiment with respect to temperature, solvent, amount and nature of the catalyst or chain stopper and the like, and hence an additional influence can be exerted on the properties, especially the physical properties, of the polymer. Above all, however, the large number of available comonomers offers practically unlimited scope for influencing the properties of the products in the desired sense. In particular, it is also possible to vary the adhesion, above all on metal substrates, and the solubility, as desired, by copolymerization of unsaturated acids, such as acrylic acid, methacrylic acid, crotonic acid, vinyl phosphonic acid or vinyl sulfonic acid or, for example, by copolymerization of dimethylmethacryloyloxymethyl-phosphine oxide.

Thus, for example, the 1:1 copolymer of 4-methyl-6-methacryloyloxymethyl-pyrone-(2) and dimethyl-(methacryloyloxymethyl)phosphine oxide exhibits excellent adhesion to an electrolytically roughened aluminum foil and dissolves very readily even in a 1:1 mixture of methanol and water. In contrast, the 1:1 copolymer of 4-methyl-6-methacryloyloxymethyl-pyrone-(2) and β-methoxy-ethyl methacrylate dissolves only in pure organic solvents such as methylene chloride or chloroform.

Polymers with a sufficient number of free acid groups or amino groups, which can be readily prepared within the scope of the invention, are adequately water-soluble, in the form of their salts with inorganic or organic bases or inorganic or organic acids, to allow them to be processed without the use of organic solvents. Copying layers which contain polymers with free acid groups thus can be developed with aqueous alkaline solutions and copying layers which contain polymers with amino groups can be developed with acid aqueous solutions, if desired with the addition of small amounts of miscible organic solvents.

EXAMPLES

All work was carried out in areas lighted with yellow light.

General instructions for a radical solution polymerization

The solution, flushed with nitrogen, of the monomer or monomers, which contains a small amount of a radical initiator, for example azoisobutyronitrile, lauroyl peroxide or benzoyl peroxide, in a suitable solvent, for example butanone, is heated, while stirring, to a polymerization temperature which depends on the initiator and is generally between 40° and 100°C, but preferably between 70° and 80°C, until the desired degree of polymerization (or the desired viscosity) is reached.

After shortstopping the polymerization, the reaction mixture is dissolved in a suitable solvent, for example acetone, and any gel particles present are removed by filtration, if necessary under pressure. To precipitate the polymer, the solution is now stirred into a suitable precipitant, for example 3:1 methanol:water. The polymer is filtered off, dried in vacuo at 40°–60°C and subsequently ground.

EXAMPLE 1

50 g of 4-methyl-6-methacryloyloxymethyl-pyrone-(2) and 25 mg of azoisobutyronitrile (AIBN) are dissolved at room temperature in 43 ml of benzene in a 4-neck flask equipped with a stirrer, a gas inlet tube, a thermometer and a reflux condenser. The solution is flushed with nitrogen until free of oxygen and is heated for 5 hours to 80°C in a nitrogen atmosphere, while stirring.

The viscous, cloudy polymer is dissolved in 600 ml of chloroform, the solution is filtered through a KOoo filter of Messrs. SeitzAsbestwerke to remove small amounts of gel particles and the polymer is precipitated by stirring the filtrate into 6 ml of an ether/petroleum ether (3:1) mixture. After drying in a vacuum drying cabinet (1 mm Hg) at 40°C, 46 g of white polymer are obtained.

In the UV spectrum, the product shows an absorption maximum at a wavelength of $\lambda_{max}(CH_2Cl_2) = 293$ nm, with an extinction of $E_{1\ cm}^{1\%} = 298$ ($E_{1\ cm}^{1\%}$ denotes the optical density of a solution of the polymer of a concentration $c = 1$ g of polymer/100 ml of solution, for a layer thickness $d = 1$ cm). The polymer has a reduced specific viscosity ($\eta_{specific}/c$, hereafter abbreviated as RSV) of 1.40 dl/g as a 1% solution in chloroform, at 25°C.

An analogous product is obtained with lauroyl peroxide as the radical initiator.

The polymer is deposited from a solution in chloroform as a film on a sheet of mechanically roughened (brushed) aluminum. After image-wise exposure for 90 seconds from a distance of 15 cm through a negative original, using a Q 81 Laboratory Immersed Lamp of Quarzlampengesellschaft Hanau, and through Solidex glass, and developing with cyclohexanone, a sharp positive image is obtained.

EXAMPLE 2

10 g of 3-chloro-4-methyl-6-methacryloyloxymethyl-pyrone-(2) and 5 mg of AIBN in 24 ml of benzene are polymerized at 80°C under the conditions of Example 1. After 6 hours the product is dissolved in chloroform, the solution is filtered through a Seitz-KOoo filter under pressure to remove fluff and the polymer is precipitated by stirring the solution into ether/petroleum ether (3:1). After drying (30°C/0.1 mm Hg) 5.7 g of a white polymer are obtained, RSV = 0.55 at 25°C (1% solution in CHCl₃)

$$\lambda_{max}(CH_2Cl_2) = 302 \text{ nm } (E_{1\ cm}^{1\%} = 278)$$

The product is applied from chloroform by casting onto mechanically roughened aluminum to give a film of a thickness of 2.6 g/m². After drying with warm air, the film is exposed using a fluorescent tube exposure apparatus which comprises 4 fluorescent tubes of type Philips TL-AK 40 W/05 arranged over an area of 20 × 60 cm, using a lamp distance of 5 – 7 cm and a Solidex glass cover plate. The exposed areas of the polymer layer are insoluble in chloroform after 15 seconds.

EXAMPLE 3

29 g of 3,4-dimethyl-6-methacryloyloxymethyl-pyrone-(2) are polymerized with 15 mg of AIBN as the initiator, in 44 ml of benzene, for 6 hours at 80°C in nitrogen under the conditions indicated in Example 1. After cooling, the mixture is diluted with 75 ml of chloroform and gel particles are removed by pressure filtration through a Seitz-KOoo filter. The highly viscous filtrate is diluted with 200 ml of chloroform and the polymer is precipitated by pouring the solution into 3 ml of ether/petroleum ether (3:1), while stirring. After drying under a vacuum (0.1 mm Hg) at 25°C and comminuting, 17.2 g of white polymer are obtained; the polymer readily dissolves in, for example, chloroform, methylene chloride, 1,2-dichloroethane and cyclohexanone. RSV = 0.65 (25°C; 1% in CHCl₃)

$\lambda_{max}(CH_2Cl_2) = 293$ nm ($E_{1\ cm}^{1\%} = 332$)

An analogous result is obtained with benzoyl peroxide as the radical initiator.

The polymer is deposited as a film, from chloroform, on a brushed aluminum plate and after 2 minutes' exposure (as in Example 2) the polymer no longer dissolves in chloroform.

EXAMPLE 4

146 g (0.7 mole) of 4-methyl-6-methacryloyloxymethyl-pyrone-(2) and 42 g (0.3 mole) of n-butyl methacrylate in 170 ml of benzene are polymerized in the presence of 100 mg of AIBN as the initiator for 5 hours at 80°C, analogously to Example 1. After cooling, the product is dissolved in 800 ml of chloroform, the solution is filtered through a Seitz-KOoo filter under pressure and, after further dilution with chloroform, the polymer is reciprocated from 10 l of ether/petroleum ether (3:1). After drying at 25°C under a vacuum of 0.1 mm Hg, 181.2 g of white polymer are obtained; the polymer readily dissolves in, for example, butanone, cyclohexanone, methylene chloride, chloroform and 1,2-dichloroethane. RSV = 1.0 (25°C; 1% in CHCl$_3$)

$\lambda_{max}(CH_2Cl_2) = 294$ nm ($E_{1\ cm}^{1\%} = 225$)

According to a determination by UV spectroscopy, the product contains 68 mole % of substituted 2-pyrone-ester groups and 32 mole % of butyl ester groups.

The polymer is deposited from chloroform as a film on a brushed aluminum plate and after 2 minutes' exposure, as in Example 2, no longer dissolves in chloroform.

EXAMPLE 5

2.6 g (12.5 mMoles) of 4-methyl-6-methacryloyloxymethylpyrone-(2) and 2.2 g (12.5 mMoles) of dimethyl-methacryloyloxymethyl-phosphine oxide in 13 ml of benzene are polymerized with 4 mg of AIBN as the initiator for 5 hours at 80°C, and worked up, analogously to Example 1. 3.7 g of white powder are obtained; the powder gives a clear solution in, inter alia, methanol, ethylene glycol monomethyl ether, dimethylformamide, methylene chloride, chloroform and methanol/water (1:1). RSV = 0.83 (25°C; 1% in CHCl$_3$)

$\lambda_{max}(CH_2Cl_2) = 293$ nm ($E_{1\ cm}^{1\%} = 140$)

The UV spectrum indicates a content of 42 mole % of substituted 2-pyrone-ester groups.

The polymer is deposited from chloroform as a film on a brushed aluminum plate. After 2 minutes' imagewise exposure, as in Example 2, through a negative original, and developing with CH$_3$OH/H$_2$O (1:1), a sharply outlined, well-adhering positive image is obtained.

EXAMPLE 6

18.8 g (90 mMoles) of 4-methyl-6-methacryloyloxymethylpyrone-(2) and 10.2 g (60 mMoles) of n-hexyl methacrylate in 26 ml of benzene are polymerized with 15 mg of AIBN as the initiator for 6 hours at 80°C, and worked up, analogously to Example 1. 24.3 g of white powder which dissolve readily in, for example, trichloroethylene, chloroform or methylene chloride, are obtained. RSV = 0.95 (25°C; 1% in CHCl$_3$)

$\lambda_{max}(CH_2Cl_2) = 294$ nm ($E_{1\ cm}^{1\%} = 203$)

The UV spectrum of the polymer indicates that it contains 63.3 mole % of substituted 2-pyrone-ester groups.

The polymer is deposited as a film from chloroform, together with 10% of its weight of Michler's ketone, on a brushed aluminum plate. After 2 minutes' exposure, as in Example 2, through a 21-step half-tone grey wedge which is described in more detail in Example 28, developing with trichloroethylene and dyeing with a 1% solution of Fat-Soluble Black HB (C.I. 26,150) in trichloroethylene, 19 steps become readily visible.

EXAMPLE 7

5.7 g (27.5 mMoles) of 4-methyl-6-methacryloyloxymethylpyrone-(2), 3.4 g (20 mMoles) of n-hexyl methacrylate and 215 mg (2.5 m Moles) of methacrylic acid in 9 ml of benzene are polymerized with 7 mg of AIBN as the initiator for 6 hours at 80°C, and worked up, analogously to Example 1. 5.6 g of white powder are obtained; this is readily soluble, inter alia, in chloroform, methylene chloride and trichloroethylene. RSV = 0.64 (25°C; 1% in CHCl$_3$)

$\lambda_{max}(CH_2Cl_2) = 292$ nm ($E_{1\ cm}^{1\%} = 162$)

An exposure test analogously to Example 6 gives comparably good results.

EXAMPLE 8

5.2 g (25 mMoles) of 4-methyl-6-methacryloyloxymethylpyrone-(2) and 4.2 g (25 mMoles) of furfuryl methacrylate in 12 ml of benzene are polymerized with 6 mg of AIBN as the initiator for 6 hours at 80°C, and worked up, analogously to Example 1. 6.9 g of white powder are obtained; this dissolves readily in, for example, dimethylformamide, methylene chloride, chloroform or butanone. RSV = 1.78 (25°C; 1% in CHCl$_3$)

$\lambda_{max}(CH_2Cl_2) = 293$ nm ($E_{1\ cm}^{1\%} = 143$)

The polymer is applied from chloroform, together with 10% of Michler's ketone, onto an electrolytically roughened aluminum plate. After 10 seconds' imagewise exposure as in Example 2, and developing with butanone, a sharp image is obtained.

EXAMPLE 9

2.1 g (10 mMoles) of 4-methyl-6-methacryloyloxymethylpyrone-(2) and 5.7 g (40 mMoles) of n-butyl methacrylate in 9 ml of benzene are polymerized with 5 mg of AIBN as the initiator for 6 hours at 80°C, as described in Example 1, and worked up analogously. 0.5 of white powder is obtained. RSV = 1.31 (25°C; 1% in CHCl$_3$)

$\lambda_{max}(CH_2Cl_2) = 294$ nm ($E_{1\ cm}^{1\%} = 95$)

According to a determination of the content by UV spectroscopy, the polymer contains 24 mole % of substituted 2-pyrone-ester groups.

The polymer, together with 10% of Michler's ketone, is applied from a chloroform solution as a film onto an electrolytically roughened aluminum foil and exposed for 2 minutes, as in Example 2, through the step wedge described in Example 28. After developing with butanone and dyeing with Fat-Soluble Black HB, 17 steps become visible.

EXAMPLE 10

5.2 g (25 mMoles) of 4-methyl-6-methacryloyloxymethylpyrone-(2) and 2.6 g (25 mMoles) of styrene in 9 ml of benzene are polymerized with 5 mg of AIBN as the initiator for 6 hours at 80°C, and worked up, under the conditions described in Example 1. 3.8 g of white powder are obtained; this is readily soluble in, for example, methylene chloride, chloroform, trichloroethylene, cyclohexanone, butanone or dimethylformamide. RSV = 1.33 (25°C; 1% in CHCl$_3$)

$\lambda_{max}(CH_2Cl_2) = 294$ nm ($E_1$ $_{cm}{}^{1\%} = 215$)

According to a determination of the content of UV spectroscopy, the polymer contains 54 mole % of substituted 2-pyrone-ester groups.

The polymer, together with 10% of Michler's ketone, is deposited as a film from chloroform on the carrier used in Example 8. After 10 seconds' exposure through an original, and development with trichloroethylene, a sharp image of the original is obtained on the carrier.

EXAMPLE 11

5.2 g (25 mMoles) of 4-methyl-6-methacryloyloxymethylpyrone-(2) and 2.6 g (25 mMoles) of 4-vinylpyridine in 10 ml of benzene are polymerized with 5 mg of AIBN as the initiator for 6 hours at 80°C under the conditions described in Example 1, and are also worked up analogously. 3.5 g of white powder are obtained; this is readily soluble in, for example, chloroform, methylene chloride or 2 N aqueous HCl. RSV = 0.96 (25°C; 1% in CHCl$_3$)

$\lambda_{max}(CH_2Cl_2) = 294$ nm ($E_1$ $_{cm}{}^{1\%} = 143$)

The polymer, together with 10% by weight of Michler's ketone, is deposited from chloroform as a film (2 g of polymer and 0.2 g of sensitizer per m$^2$) on the carrier used in Example 8. After 2 minutes' exposure as in Example 2 through the step wedge described in Example 28, and subsequent development with methylene chloride, 17 steps become visible.

EXAMPLE 12

5.2 g (25 mMoles) of 4-methyl-6-methacryloyloxymethylpyrone-(2) and 3.6 g (25 mMoles) of β-methoxyethyl methacrylate in 9 ml of benzene are polymerized with 5 mg of AIBN as the initiator for 6 hours at 80°C as described in Example 1 and worked up analogously. 8.1 g of white powder which is readily soluble in methylene chloride, chloroform, butanone or ethylene glycol monomethyl ether are obtained. RSV = 1.1 (25°C; 1% in CHCl$_3$)

$\lambda_{max}(CH_2Cl_2) = 293$ nm ($E_1$ $_{cm}{}^{1\%} = 172$)

According to a determination of the content by UV spectroscopy, the polymer contains 48.5 mole % of substituted 2-pyrone-ester groups and 51.5 mole % of pyridine radicals.

A thin film of the polymer, containing 10% by weight of Michler's ketone, on the carrier used in Example 8, was insoluble in butanone after 10 seconds' exposure.

EXAMPLE 13

17.2 g (83 mMoles) of 4-methyl-6-methacryloyloxymethylpyrone-(2) (I) and 13.4 g (68 mMoles) of 2-ethyl-hexyl methacrylate (II), (molar ratio (I):(II) = 55:45), in 26 ml of benzene are polymerized with 15 mg of AIBN for 6 hours at 80°C as described in Example 1, and worked up analogously. 24 g of white powder are obtained; this dissolves, inter alia, in trichloroethylene, butanone, cyclohexanone and toluene/ethylene glycol methyl ether acetate (1:1), (1:2) or (2:1). RSV = 0.92 (25°C; 1% in CHCl$_3$)

$\lambda_{max}(CH_2Cl_2) = 294$ nm ($E_1$ $_{cm}{}^{1\%} = 167$)

According to a determination of the content by UV spectroscopy, the polymer contains 54.8 mole % of substituted 2-pyrone-ester groups and 45.2 mole % of 2-ethyl-hexyl ester groups.

A film of the polymer, on the carrier used in Example 8, is insoluble in chloroform after 2 minutes' exposure.

EXAMPLE 14

6.2 g (30 mMoles) of 4-methyl-6-methacryloyloxymethylpyrone-(2) and 2 g (20 mMoles) of ethyl acrylate in 20 ml of benzene are polymerized with 6 mg of AIBN for 6 hours at 80°C, as described in Example 1, and worked up analogously. 2.5 g of powder which is readily soluble in methylene chloride or chloroform are obtained. RSV = 0.42 (25°C; 1% in CHCl$_3$)

$\lambda_{max}(CH_2Cl_2) = 294$ nm ($E_1$ $_{cm}{}^{1\%} = 220$)

A film of the polymer, on the carrier used in Example 8, is insoluble in chloroform after 2 minutes' exposure as in Example 2.

EXAMPLE 15

7.8 g (37.5 mMoles) of 4-methyl-6-methacryloyloxymethylpyrone-(2) and 0.66 g (12.5 mMoles) of acrylonitrile in 10 ml of benzene are polymerized with 5 mg of AIBN as the initiator for 6 hours at 80°C as described in Example 1. After shortstopping the polymerization, the soluble part of the polymer is taken up in chloroform, precipitated by stirring into ether/petroleum ether (3:1), dried (at 40°C and 1 mm Hg) and powdered. 2.5 g are obtained. RSV = 0.3 (25°C; 1% in CHCl$_3$)

$\lambda_{max}(CH_2Cl_2) = 294$ nm ($E_1$ $_{cm}{}^{1\%} = 260$)

According to a determination of the content by UV spectroscopy, the polymer contains 63 mole % of substituted 2-pyrone-ester groups.

The IR spectrum in KBr shows a weak nitrile band at 2,230 cm$^{-1}$.

The polymer (2 g/m$^2$), together with 10% of Michler's ketone (0.2 g/m$^2$) is deposited as a film on the carrier used in Example 8 and exposed for 2 minutes as in Example 2, through the step wedge described in Example 28. After developing with butanone/CH$_2$Cl$_2$ (1:1) 16 steps are recognizable.

EXAMPLE 16

7.8 g (37.5 mMoles) of 4-methyl-6-methacryloyloxymethylpyrone-(2) and 1.2 g (12.5 mMoles) of freshly distilled maleic anhydride in 14 ml of absolute benzene are polymerized with 9 mg of AIBN for 6 hours at 80°C as described in Example 1. After shortstopping the polymerization, the part of the polymer which is soluble in CHCl$_3$ is precipitated, as in Example 15, by stirring into ether/petroleum ether (3:1), dried (at 40°C and 1 mm Hg) and powdered. 1.9 g are obtained.

$\lambda_{max}(CH_2Cl_2) = 294$ nm $(E_1$ $_{cm}^{1\%} = 276)$

The IR spectrum of the polymer has a distinct anhydride double band at 1,840 cm$^{-1}$ and 1,770 cm$^{-1}$.

The polymer (2 g/m$^2$), together with 10% of Michler's ketone, is deposited as a film on the carrier used in Example 8 and exposed for 2 minutes as in Example 2, through the step wedge described in Example 28. After developing with methylene chloride/butanone (4:1), 15 steps become visible.

EXAMPLE 17

1,522 g of 4-methyl-6-methacryloyloxymethyl-pyrone-(2) containing 43.2% of water (corresponding to 866 g = 4.16 moles of dry product) and 491 g (4.16 moles) of vinyl toluene in 1,630 ml of butanone are polymerized with 2.5 g of AIBN for 24 hours at 80°C as described in Example 1. The viscous cloudy polymer is dissolved in 6 l of acetone, the solution is filtered through a pressure filter to remove a little fluff and the polymer is precipitated by stirring the solution into 18 l of methanol/water (3:1). After drying at 60°C in a vacuum drying cabinet (1 mm Hg) and comminuting, 1,189 g of white powder are obtained; this is readily soluble in, inter alia, chloroform, methylene chloride, trichloroethylene and butanone. RSV = 0.71 (25°C; 1% in CHCl$_3$)

$\lambda_{max}(CH_2Cl_2) = 294$ nm $(E_1$ $_{cm}^{1\%} = 202)$

The UV spectrum of the polymer indicates that it contains 51.7 mole % of substituted 2-pyrone-ester groups.

Determination of water (according to K. Fischer): 0.5% of water.

An exposure test as in Example 16 gives comparably good results.

EXAMPLE 18

4-Methyl-6-chloromethyl-pyrone-(2) (prepared according to G. Lohaus et al., Chem. Ber. 100 (1967), 658) gives, via its urotropine salt, 4-methyl-6-aminomethyl-pyrone-(2), melting point 65°-66°C, and this gives 4-methyl-6-methacryloylamino-methyl-pyrone-(2), according to methods which are in themselves known.

| Melting point: | 92° – 92.5°C | | C$_{11}$H$_{13}$NO$_3$ |
|---|---|---|---|
| Calculated: | C 63.75%; | H 6.32%; | N 6.76% |
| Found: | C 63.8 %; | H 6.4 %; | N 7.0 % |

2.1 g (10 mMoles) of 4-methyl-6-methacryloylaminomethylpyrone-(2) and 1.7 g (10 mMoles) of n-hexyl methacrylate in a mixture of 8 ml of benzene and 6 ml of butanone are polymerized with 5 mg of AIBN for 6 hours at 80°C, as in Example 1, and worked up analogously.

2.5 g of white powder which dissolves readily in methylene chloride, chloroform or butanone are obtained. RSV = 0.16 (25°C; 1% in CHCl$_3$)

$\lambda_{max}(CH_2Cl_2) = 296$ nm $(E_1$ $_{cm}^{1\%} = 171)$

After 2 minutes' exposure of a film of the polymer, containing 10% of Michler's ketone, on the carrier used in Example 8, through the step wedge used in Example 28, and developing with butanone, 10 steps are recognizable.

EXAMPLE 19

2.1 g (10 mMoles) of 4-methyl-6-methacryloylaminomethylpyrone-(2) and 1.2 g (10 mMoles) of vinyl toluene in 7 ml of butanone are polymerized with 5 mg of AIBN for 6 hours at 80°C as described in Example 1, and worked up analogously. 2.3 g of white powder are obtained. RSV = 0.15 (25°C; 1% in CHCl$_3$)

$\lambda_{max}(CH_2Cl_2) = 295$ nm $(E_1$ $_{cm}^{1\%} = 190)$

The polymer (2 g/m$^2$), together with 10% of Michler's ketone, is deposited as a film on the carrier used in Example 8. After exposure as in Example 2, through the step wedge described in Example 28, and developing with butanone, 8 steps become visible.

EXAMPLE 20

0.75 g (3.4 mMoles) of a mixture of 70% of 4,6-dimethyl-3-methacryloyloxymethyl-pyrone-(2) and 30% of 4,6-dimethyl-5-methacryloyloxymethyl-pyrone-(2) and 0.4 g (3.4 mMoles) of vinyl toluene, in 3 ml of butanone, are polymerized with 4 g of AIBN for 16 hours at 80°C, as described in Example 1, and worked up analogously. 0.9 g of powder is obtained. RSV = 0.5 (25°C; 1% in CHCl$_3$)

$\lambda_{max}(CH_2Cl_2) = 304$ nm $(E_1$ $_{cm}^{1\%} = 211)$

A film of the polymer (2 g/m$^2$), which contains 10% of Michler's ketone, is exposed for 2 minutes, as in Example 2, through the step wedge described in Example 28. After developing with butanone, 19 steps are visible.

If pure 4,6-dimethyl-3-methacryloyloxymethyl-pyrone-(2) is used instead of the above isomer mixture, analogous results are obtained.

EXAMPLE 21

4 g of a polyvinyl alcohol of which a 4% by weight aqueous solution has a viscosity of 4 cP/20°C, and which has a degree of saponification of 88%, are dissolved in a mixture of 70 ml of ethanol/water (1:1) at 35°C by adding 1.6 g of concentrated sulfuric acid, a solution, at 35°C, of 7 g of 4-methyl-6-formyl-pyrone-(2) (Chem. Ber. 100 (1967), 658-677) in 70 ml of ethanol/water (1:1) is added and the resulting solution is heated to 50°-55°C for 5 hours. After cooling to 20°-25°C, 5.5 g of concentrated sulfuric acid in 400 ml of water are stirred into this solution. Overnight, a transparent viscous oil separates out, which dissolves in 30 ml of ethanol/dilute aqueous NaHCO$_3$ solution (1:1). The solution is clarified by filtration through a pressure filter plate carrying a Seitz-KOoo filter and then stirred into 150 ml of water. The precipitate thereby obtained is dried at 50°C and 1 mm Hg over phosphorus pentoxide. 3.1 g of white powder are obtained.

$\lambda_{max}($ethanol/H$_2$O = 1:1$) = 290$ nm $(E_1$ $_{cm}^{1\%} = 81)$

The UV spectrum shows that 15% of the hydroxyl groups of the polymer are acetalized by 4-methyl-6-formylpyrone-(2).

The polymer, as a solution in ethanol/water (1:1), is applied to a substrate of brushed aluminum to give a dry coating thickness of 2 g/m². After the initial drying, 10% of Michler's ketone (0.2 g/m²), dissolved in ethanol/chloroform (4:1), are added to the film. The material is exposed for 2 minutes, as in Example 2, through the step wedge described in Example 28, and is then developed with ethanol/water (1:1). After rinsing with methanol, the film is dyed with aqueous methylene blue solution; 8 steps are easily recognizable.

EXAMPLE 22

3.5 g (25 mMoles) of 4-methyl-6-vinyl-pyrone-(2), obtained by eliminating HCl from 4-methyl-6-chloroethyl-pyrone-(2) (the latter obtained according to G. Lohaus, loc. cit.) and 2.6 (25 mMoles) of styrene in 9 ml of benzene are polymerized with 5 mg of AIBN for 6 hours at 80°C, as in Example 2, and worked up analogously. 4.2 g of powder are obtained. RSV = 0.13 (25°C; 1% in CHCl₃)

$\lambda_{max}(CH_2Cl_2) = 300$ nm ($E_1{}_{cm}{}^{1\%} = 294$)

The polymer is readily soluble in chloroform, methylene chloride, butanone, dimethyl formamide, cyclohexanone, ethylene glycol methyl ether acetate, and ethylene glycol monomethyl ether.

The polymer (2 g/m²) together with 10% of Michler's ketone is deposited as a film on the carrier used in Example 8. After 2 minutes' exposure through a stencil, development with butanone and dyeing with a 1% solution of Fat-Soluble Black HB in isopropanol/methylene chloride (4:1), a clear negative image of the original becomes visible.

EXAMPLE 23

1.7 g (12.5 mMoles) of 4-methyl-6-vinyl-pyrone-(2) and 2.2 g (12.5 mMoles) of n-hexyl methacrylate in 5 ml of benzene are polymerized with 4 mg of AIBN for 6 hours at 80°C, and worked up, analogously to Example 2. 2 g of white powder are obtained. RSV = 0.2 (25°C; 1% in CHCl₃)

$\lambda_{max}(CH_2Cl_2) = 300$ nm ($E_1{}_{cm}{}^{1\%} = 296$)

The polymer is readily soluble in ethylene glycol methyl ether acetate, dimethyl formamide, chloroform or methylene chloride. On the carrier used in Example 8, the product shows analogous properties to the polymer from Example 22.

EXAMPLE 24

4-Methyl-6-carboxy-pyrone-(2) (obtained according to Helv. Chim. Acta 53, Fasc. 8 (1970)) is converted with SOCl₂, in the presence of dimethyl formamide, into 4-methyl-6-chloroformyl-pyrone-(2), melting point 78°C.

2 g of the pulverulent polyvinyl alcohol described in Example 21, which has been dried at 100°C and under a vacuum of 0.1 mm Hg, are swelled in 20 ml of absolute pyridine for 24 hours at 100°C and diluted with a further 20 ml of pyridine. After cooling to 50°C, 0.25 g of 1,4-diazabicyclo- 2,2,2-octane in 2 ml of absolute pyridine is added, and 3.5 g of 4-methyl-6-chloroformyl-pyrone-(2) are also added, in portions, at the same temperature. After stirring for 8 hours at 50°C, 50 ml of acetone are added, the mixture is filtered under pressure through a Seitz EK filter and the slightly reddish filtrate is stirred into 1 liter of water. The white precipitate is dried at 70°C and a vacuum of 1 mm Hg over phosphorus pentoxide. 3.5 g are obtained.

The polymer is soluble in, for example, cyclohexanone/ethylene glycol methyl ether acetate (1:1), N,N-dimethylformamide and dimethyl sulfoxide.

$\lambda_{max}(DMF) = 298$ nm ($E_1{}_{cm}{}^{1\%} = 353$)

A film of the polymer (2 g/m²) and 10% of Michler's ketone on the carrier used in Example 8 is exposed for 2 minutes through the step wedge described in Example 28. After developing with methylglycol acetate/cyclohexanone, 11 sharp steps, which can be dyed with 1% aqueous methylene blue solution, are recognizable.

EXAMPLE 25

4,6-Dimethyl-5-carboxy-pyrone-(2) (isodehydroacetic acid, according to Org. Synth. No. 32, page 76) is converted with SOCl₂, in the presence of N,N-dimethylformamide, into 4,6-dimethyl-5-chloroformyl-pyrone-(2) (melting point:50° - 51°C).

4.1 g of a polyvinyl alcohol which is 70% acetalized with butyraldehyde, contains 26% of free hydroxyl groups and is 1% acetylated, and of which a 6% solution in methanol has a viscosity of 5 cP/20°C, are dissolved in 30 ml of absolute dioxane, in the presence of 6.9 g of 4,6-dimethyl-5-chloroformyl-pyrone-(2), while stirring at room temperature. After 5 hours, a solution of 0.5 g of 1,4-diaza-bicyclo-[2,2,2]-octane in 3 ml of absolute pyridine and 20 ml of absolute dioxane is added dropwise over the course of 10 minutes while cooling with ice and the whitish-pink suspension is stirred for a further 2 hours at room temperature. After standing overnight, a further 45 ml of dioxane are stirred in and the polymer is precipitated by stirring the suspension into 600 ml of water. The resulting precipitate is dissolved in 200 ml of acetone/ethanol (1:1) and is again precipitated, after filtering the solution through a Seitz EK filter, by stirring the filtrate into 2 l of water. After adding a little sodium chloride, the polymer, which in part is still colloidally dissolved, flocculates completely.

After drying in vacuo at 60°C over phosphorus pentoxide, and subsequent comminution, 4.9 g of a light beige powder are obtained.

$\lambda_{max}(CH_3OH) = 294$ nm ($E_1{}_{cm}{}^{1\%} = 40$)

The polymer is deposited as a film (4 g/m²) together with 10% of Michler's ketone from acetone/ethanol (1:1) on the aluminum foil used in Example 8. After 20 minutes' exposure, as in Example 2, through the step wedge described in Example 28, which is covered with a Solidex glass plate, developing with acetone/ethanol (1:1) and dyeing with a 1% Fat-Soluble Black HB solution in trichloroethylene, 9 steps become easily visible.

EXAMPLE 26

4-Methyl-6-hydroxymethyl-pyrone-(2) is obtained by known methods from 4-methyl-6-chloromethyl-pyrone-(2) (G. Lohaus, loc, cit.) via 4-methyl-6-acetoxymethyl-pyrone-(2).

A solution of 4.2 g of 4-methyl-6-hydroxymethyl-pyrone-(2) and 6.1 g of a (1:1) copolymer of styrene and maleic anhydride, which has been dried for 5 hours at 80°C in vacuo, in 60 ml of dry pyridine, is heated for 18 hours under reflux. After cooling and diluting with 60 ml of acetone, the polymer is precipitated by stirring the mixture into dilute acetic acid. The precipitate is twice redissolved in pyridine and reprecipitated by stirring into dilute acetic acid, thoroughly rinsed with water, dried in vacuo at 40°C and ground.

8.3 g of white powder are obtained.

$\lambda_{max}$(DMF) = 294 nm ($E_{1\ cm}^{1\%}$ = 208)

Upon exposure, a film of the polymer on the carrier used in Example 8 becomes insoluble in the exposed areas.

EXAMPLE 27

4,6-Dimethyl-3-chloroformylmethyl-pyrone-(2) is prepared according to known methods from 4,6-dimethyl-pyrone-(2) via 4,6-dimethyl-3-chloromethyl-pyrone-(2), 4,6-dimethyl-3-cyanomethylpyrone-(2) and 4,6-dimethyl-3-carboxymethyl-pyrone-(2).

A solution of 10.8 g of a cresol-formaldehyde novolak (tradename Alnovol PN 320) in 150 ml of dry dioxane is mixed with 22 g of 4,6-dimethyl-3-chloroformylmethyl-pyrone-(2) in 100 ml of dry dioxane and 12.4 g of 1',4-diaza-bicyclo-[2,2,2]-octane in 50 ml of dioxane are added dropwise over the course of 10 minutes, while stirring. After standing overnight, the polymer is precipitated by stirring the mixture into water, and is filtered off. After 10 hours' drying at 50°C in vacuo, 24.2 g of polymer are obtained.

$\lambda_{max}$(DMF) = 293 nm ($E_{1\ cm}^{1\%}$ = 230)

A film of the polymer which contains 10% of Michler's ketone becomes insoluble in the exposed areas after 2 minutes' exposure.

EXAMPLE 28

This example shows the ability to sensitize photocrosslinkable polymers of the pyrone type with a number of sensitizers.

The polymer of which the preparation was described in Example 4 is representative of an entire series of polymers of this type.

5% (based on solids) of the sensitizers are added to 6% solutions of this polymer in methyl ethyl ketone. The solutions are whirler-coated at 80 revolutions per minute onto electrolytically roughened aluminum carriers, dried for 30 minutes with a hot air blower and, after storage overnight, exposed for 2 minutes through a screen negative and a 21-step grey wedge (density range 0.05 – 3.05, density increment 0.15) to a 5 KW xenon impulse lamp at a distance of 80 cm. The material is developed by dipping for 1 minute in methyl ethyl ketone and drying. In order to render the image more readily visible, a 1% solution of Fat-Soluble Black HB (C.I. 26,150) in methyl ethyl ketone is poured over the developed samples, which are then rinsed with isopropanol to remove excess dyestuff.

| Sensitizer | Fully depicted wedge steps |
|---|---|
| None | 0 + (but screen area is depicted) |
| 2-Ethylanthraquinone | 5 |
| 2-Chloro-4-nitroaniline | 7 |
| 4-Anisyl-2,6-diphenyl-thiopyrylium perchlorate | 7 |
| Thioxanthone | 10 |
| 1,2-Benzacridine | 2 |
| Michler's ketone | 10 |
| Phenanthrenequinone | 2 |
| 2,6-Bis-(4'-azidostyryl)-4-methyl-cyclohexanone | 10 |
| Xanthone | 4 |
| Xanthone/Michler's ketone/benzil 4:1:1 | 8 |
| 5-Nitro-acenaphthene | 7 |
| 1-Ethoxycarbonyl-2-keto-3-methyl-3-aza-benzanthrone | 7 |

+ On quadrupling the period of exposure, a step wedge length of 1 is reached.

After rendering the non-image areas hydrophilic, the plates can be used as planographic printing plates.

EXAMPLE 29

A 30μ thick copper foil laminated onto a phenolic resin compression moulding composition is first cleaned by rubbing it down with abrasive, briefly dipping it into a mixture of 1 part of concentrated HCl and 3 parts of water, rinsed with acetone and dried.

A 6% solution of the polymer described in Example 6, in methyl ethyl ketone, is now applied by whirler-coating so that a layer of a dry thickness of 2–3μ is produced.

This is further dried for 2 minutes at 60°C and is exposed for 2 minutes through a negative original of an electrical circuit diagram under a 5 KW xenon impulse lamp. After developing with methyl ethyl ketone, the material is dried and the copper foil is etched away in the usual manner with iron chloride solution in the areas which have been bared. A printed circuit of good quality is obtained. The etch resist thereafter can be removed with commercially available strippers.

Under the same conditions, etch resists of good etch resistance are obtained upon using the polymers of which the preparation is described in Examples 7, 8, 9, 10 and 12. However, development is effected with ethylene glycol methyl ether acetate.

EXAMPLE 30

A copper carrier, purified as in Example 29, is coated by dipping it into a copying lacquer solution of the composition shown below and drawing it out of the solution so slowly that the film of solution dries on directly and gives a dry coating thickness of 2μ.

The copying lacquer, which shows good stability upon storage, contains the polymer described in Example 17 dissolved in trichloroethylene at a concentration of 5.5%, and 5% of added Michler's ketone, based on the solids content.

After image-wise exposure, which is effected as in Example 29, the material is developed by rinsing with a mixture of equal amounts by weight of ethylene glycol methyl ether acetate and xylene. The resist thus obtained is resistant to electroplating and displays only slight underetching during the etching process.

EXAMPLE 31

4-Methyl-6-methacryloyloxymethyl-pyrone-(2) (according to the invention, in butanone, for Preparation 1) and 7-methacryloyloxycoumarin (according to DOS 1,570,224, in dimethyl formamide, for Preparation 2)

are polymerized with azoisobutyronitrile, analogously to Example 1. The products obtained have RSV values in dimethyl formamide of 0.56 (Preparation 1) and 0.32 (Preparation 2).

The polymers are deposited from their solution in dimethyl formamide, together with 10% of Michler's ketone, on the carrier from Example 8 (2 g of polymer/m²). After 5 minutes' exposure according to Example 2 through the step wedge described in Example 28, developing with dimethyl-formamide, dyeing with Fat-Soluble Black HB in methylene chloride and removing excess dyestuff with isopropanol, 20 steps become visible in the case of Preparation 1 and only 17 steps in the case of Preparation 2.

While the polymer according to the invention is soluble even in chloroform and methylene chloride and hence can also be developed with these solvents, comparison preparation 2 only dissolves in dimethylformamide.

It will be obvious to those skilled in the art that many modifications may be made within the scope of the present invention without departing from the spirit thereof, and the invention includes all such modifications.

What is claimed is:

1. A photo-crosslinkable polymer comprising about 5 to 100 mole per cent of polymerized vinyl or vinylidene units bonded via an ester, amide, or acetal group to a radical of a 2-pyrone compound, and about 0 to 95 mole percent of non-photosensitive comonomer units.

2. A photo-crosslinkable polymer which is a polyester of a polymeric polyhydroxy compound with a 2-pyrone derivative containing carboxyl groups.

3. A photo-crosslinkable polymer which is a polyacetal of a polymeric polyhydroxy compound with a 2-pyrone derivative containing aldehyde groups.

4. A polymer according to claim 1 in which the comonomer units are units of ethylene, vinyl esters, acrylic or methacrylic esters, amides or nitriles, maleic anhydride, vinyl-heterocyclic compounds, or vinyl-aromatic compounds.

5. A polymer according to claim 1 in which the units containing 2-pyrone groups have the formula

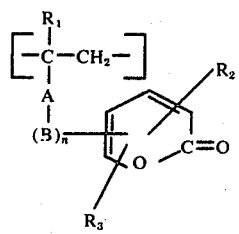

in which $R_1$, $R_2$ and $R_3$ are hydrogen, halogen, or alkyl with 1 to 4 carbon atoms,
A is one of the groups -CONH-, -COO-, -OCO-, -O-CHOH-, or -O-CH-O-,
wherein each oxygen atom of the last-stated group is bonded to one unit of the base chain,
B is an alkylene or alkyleneoxy group with 1 to 4 carbon atoms, and $n$ is 0 or 1.

6. A polymer according to claim 5 in which the B group is interrupted by an oxygen or sulfur atom or a sulfonyl group.

7. A polymer according to claim 5 in which the comonomer units are units of ethylene, vinyl esters, acrylic or methacrylic esters, amides or nitriles, maleic anhydride, vinyl-heterocyclic compounds, or vinyl-aromatic compounds.

8. A polymer according to claim 7 which is a copolymer of an alkyl acrylate or alkyl methacrylate with an acrylate or methacrylate of a 2-pyrone containing hydroxyl groups.

9. A polymer according to claim 7 which is a copolymer of a vinyl compound and a vinyl ester of a 2-pyrone containing a carboxyl group.

10. A polymer according to claim 7 which is a copolymer of n-butyl-methacrylate and 4-methyl-6-methacryloyloxymethyl-pyrone-(2).

11. A polymer according to claim 7 which is a copolymer of n-hexyl-methacrylate and 4-methyl-6-methacryloyloxymethyl-pyrone-(2).

12. A polymer according to claim 7 which is a copolymer of n-hexyl-methacrylate and 4-methyl-6-methacryloyloxymethyl-pyrone-(2).

13. A polymer according to claim 7 which is a copolymer of vinyl toluene and 4-methyl-6-methacryloyloxymethyl-pyrone-(2).

14. A process for the preparation of a photo-crosslinkable polymer which comprises polymerizing a 2-pyrone compound containing a polymerizable vinyl or vinylidene group, the 2-pyrone group and the polymerizable vinyl or vinylidene group being linked together via an ester or an amide group.

15. A process according to claim 14 in which the 2-pyrone is copolymerized with a non-photosensitive polymerizable ethylenically unsaturated compound.

16. A process for the preparation of a photo-crosslinkable polymer which comprises esterifying or acetalizing a polymeric polyhydroxy compound with a 2-pyrone derivative having carboxyl or aldehyde groups, respectively.

* * * * *